(12) United States Patent
Schmitt et al.

(10) Patent No.: US 8,551,882 B2
(45) Date of Patent: Oct. 8, 2013

(54) BACK-SIDE CONTACT FORMATION

(75) Inventors: Florian Schmitt, Winsen/Luhe (DE); Michael Ziesmann, Hamburg (DE)

(73) Assignee: NXP B.V., Eindhoven (NL)

( * ) Notice: Subject to any disclaimer, the term of this patent is extended or adjusted under 35 U.S.C. 154(b) by 32 days.

(21) Appl. No.: 13/159,852

(22) Filed: Jun. 14, 2011

(65) Prior Publication Data
US 2012/0319250 A1 Dec. 20, 2012

(51) Int. Cl.
*H01L 21/44* (2006.01)

(52) U.S. Cl.
USPC .................................. 438/667; 257/E21.577

(58) Field of Classification Search
USPC ................. 438/129, 599, 612, 618, 622, 667; 257/E21.577
See application file for complete search history.

(56) References Cited

U.S. PATENT DOCUMENTS

| 6,960,837 | B2 | 11/2005 | Iadanza |
| 7,659,595 | B2 * | 2/2010 | Shiau et al. .................. 257/459 |
| 2009/0014888 | A1 | 1/2009 | Lee et al. |
| 2009/0020842 | A1 | 1/2009 | Shiau et al. |
| 2010/0182041 | A1 | 7/2010 | Feng et al. |
| 2011/0068456 | A1 | 3/2011 | Sasaki et al. |
| 2011/0084385 | A1 | 4/2011 | Itaya et al. |

* cited by examiner

*Primary Examiner* — Quoc Hoang

(57) ABSTRACT

In one embodiment, a semiconductor is provided comprising a substrate and a plurality of wiring layers and dielectric layers formed on the substrate, the wiring layers implementing a circuit. The dielectric layers separate adjacent ones of the plurality of wiring layers. A first passivation layer is formed on the plurality of wiring layers. A first contact pad is formed in the layer and connected to the contact pad. A through silicon via (TSV) is formed through the substrate, the plurality of wiring and dielectric layers, and the passivation layer. The TSV is electrically connected to the wire formed on the passivation layer. The TSV is electrically isolated from the wiring layers except for the connection provided by the metal wire formed on the passivation layer.

13 Claims, 5 Drawing Sheets

BACK-SIDE CONTACT FORMATION

One of the major trends in the semiconductor packaging industry is to use surface-mount technology (SMT) as a replacement for conventional plated-through-hole (PTH) technology. SMT offers several distinct advantages over PTH technology, such as greater packaging density, higher lead counts with shorter interconnection lengths and easier automation. Since SMT requires electronic devices and components to be mountable on the surface of a printed circuit board (PCB) or substrate, the materials and structure of traditional through-hole components including capacitors, resistors, and inductors have to be redesigned to meet the modern-day demand for short, thin, light, and small electronic devices. Examples of semiconductor devices accomplishing these objects include quad-flat, non-leaded packages. Quad-flat, non-leaded packages have a package structure in which space-consuming outer leads protruding laterally out of a package are eliminated. Instead, external electrode pads, which are to eventually be electrically connected to a circuit board, are provided on the bottom surface of the quad-flat, non-leaded package. The bottom surface of the package that connects to the circuit board may be referred to as the back-side of the package as used herein.

Depending on the packaging and stacking of semiconductor dice for an application, it may be more desirable to implement a die with either front-side or back-side contacts. Ultimately, it may be necessary to implement different die layouts with different contacts for several applications. However, fabricating different die layouts for different packages and/or applications increases production complexity and costs.

One or more embodiments may address one or more of the above issues.

In one embodiment, a semiconductor is provided comprising a substrate and a plurality of wiring layers and dielectric layers formed on the substrate, the wiring layers implementing a circuit. The dielectric layers separate adjacent ones of the plurality of wiring layers. A first passivation layer is formed on the plurality of wiring layers. A first contact pad is formed in the passivation layer and electrically coupled to the circuit. A wire is formed on the passivation layer and connected to the contact pad. A through silicon via (TSV) is formed through the substrate, the plurality of wiring and dielectric layers, and the passivation layer. The TSV is electrically connected to the wire formed on the passivation layer. The TSV is electrically isolated from the wiring layers except for the connection provided by the metal wire formed on the passivation layer.

In another embodiment, a method of forming a plurality of semiconductors is provided. A plurality of identical semiconductor dice is formed. Each die includes a substrate and a plurality of wiring layers and dielectric layers. The dielectric layers separate adjacent ones of the wiring layers and the wiring layers implement a circuit. A passivation layer is formed on the plurality of wiring layers. A front-side contact pad is formed in the passivation layer and electrically coupled to the circuit. A via stack is formed through the plurality of wiring and dielectric layers, the via stack is electrically isolated from the circuit implemented by the wiring layers. For each of a first subset of the plurality of identical semiconductor dice including at least one die, the circuit is left electrically isolated from the via stack. For each of a second subset of the plurality of identical semiconductor dice, the second subset is mutually exclusive from the first subset and includes at least one die, a back-side contact is formed. The back-side contact is formed by forming a first via through the passivation layer and electrically coupled to the via stack, forming a wire on the passivation layer to electrically couple the front-side contact pad to the first via, and forming a second via extending from a back-side of the substrate and through the substrate.

In yet another embodiment, a method of forming a semiconductor with a back-side contact is provided. A semiconductor die including a substrate and a plurality of wiring layers and dielectric layers is formed. The dielectric layers separate adjacent ones of the wiring layers, and the wiring layers implement a circuit. A passivation layer is formed on the plurality of wiring layers. A front-side contact pad is formed in the passivation layer and electrically coupled to the circuit. A via stack is formed through the plurality of wiring and dielectric layers. The via stack is electrically isolated from the circuit implemented by the wiring layers. The die is reconfigured to have a back-side contact by performing the steps including: forming a first via through the passivation layer. The first via is electrically coupled to the via stack. A wire electrically coupling the front-side contact pad to the first via is formed on the passivation layer. A second via electrically coupled to the via stack is formed. The second via extends from a back-side of the substrate and through the substrate.

The above discussion is not intended to describe each embodiment or every implementation. Various example embodiments may be more completely understood in consideration of the following detailed description in connection with the accompanying drawings, in which.

Figure 1:
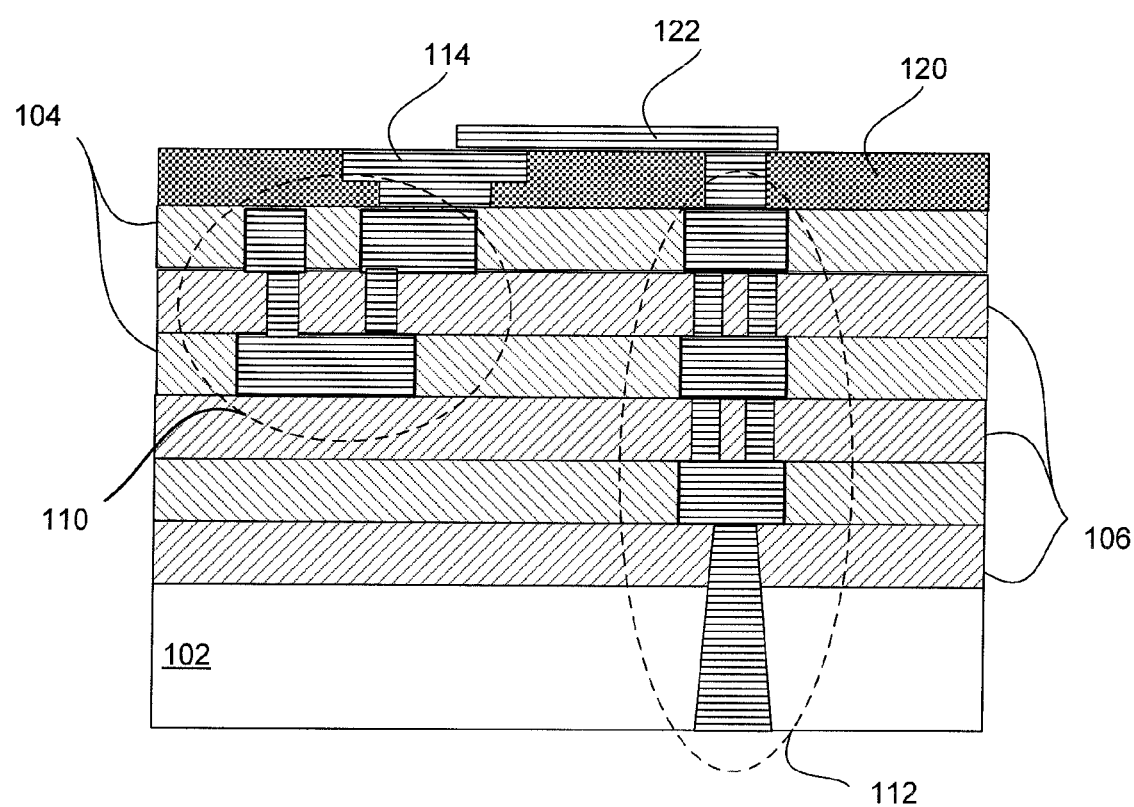
FIG. 1 shows a semiconductor reconfigured in post-fabrication processing to have a back-side contact.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

In one or more embodiments, a semiconductor die is provided that may be easily reconfigured, via post fabrication processes, to implement back-side contacts. Such capability allows a batch of identical semiconductor dice to be used for a wider variety of applications. Some of the dice may be used in packages in which front-side contacts are used, and others of the dice may be used in packages in which the back-side contacts are used. Due to this increase versatility and simplified fabrication, manufacturing costs can be reduced and various combinations of different integrated circuit dice can be combined, e.g., for fast prototyping.

In one embodiment, a die having one or more front-side contacts may be reconfigured to use back-side contacts. FIG. 1 shows a semiconductor reconfigured in post-fabrication processing to have a back-side contact. A plurality of wiring layers 104 and dielectric layers 106 are formed on a substrate layer 102. The dielectric layers 106 separate adjacent ones of the plurality of wiring layers 104. A number of stacked vias and metal plates together implement a through silicon via (TSV) 112 passing through the wiring 104, dielectric 106, and substrate 102 layers. The wiring layers are patterned to implement a circuit 110 coupled to a front-side contact pad 114 and a portion of the TSV.

Prior to post-fabrication configuration, the die may be used in a number of applications which use the front-side contact pad. In such applications, the TSV 112 remains electrically isolated from the circuit 110. To configure the die to have a back-side contact, a wire 122 is formed over the passivation layer 120 to couple the TSV 112 to the front-side contact. As a result, a path is formed between the circuit 110 and the back-side of the die.

Figure 2:
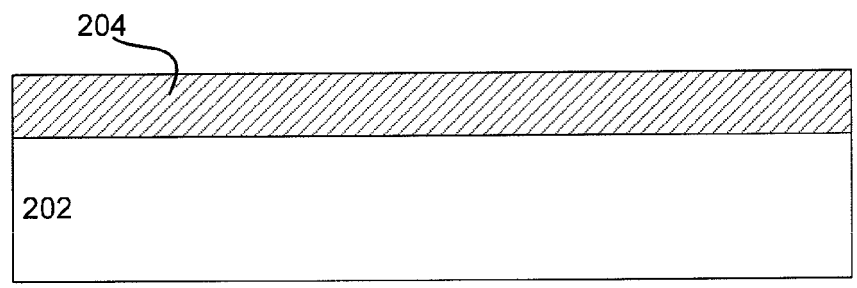
FIGS. 2 through 4 illustrate the fabrication of a reconfigurable semiconductor.
Figure 3:
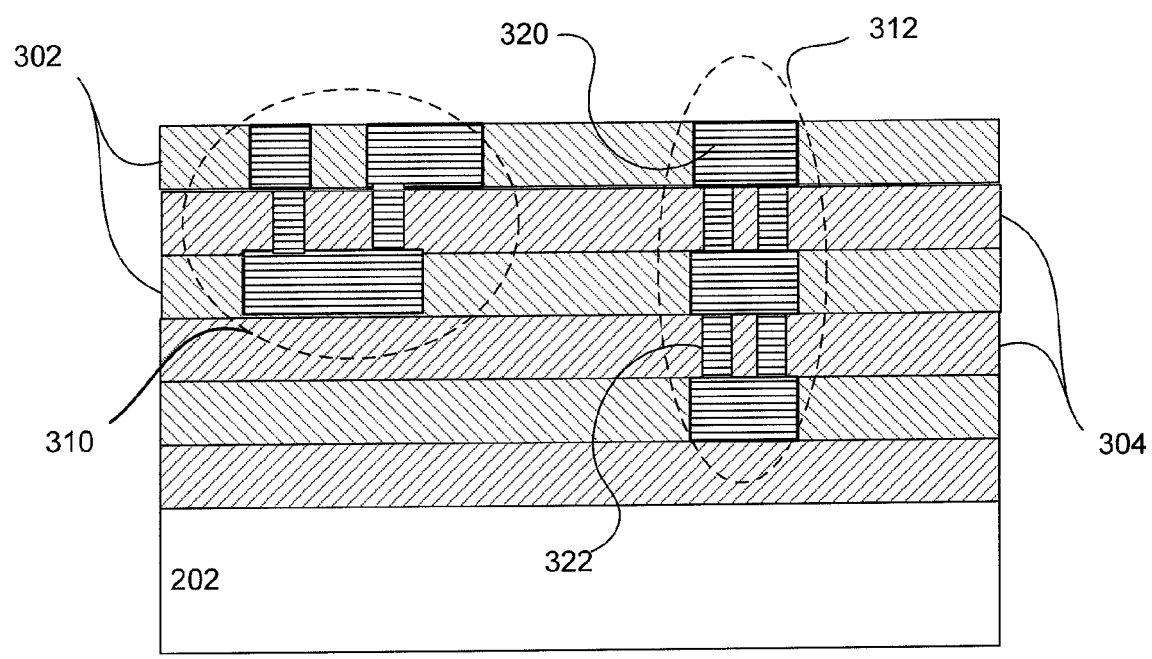
Figure 4:
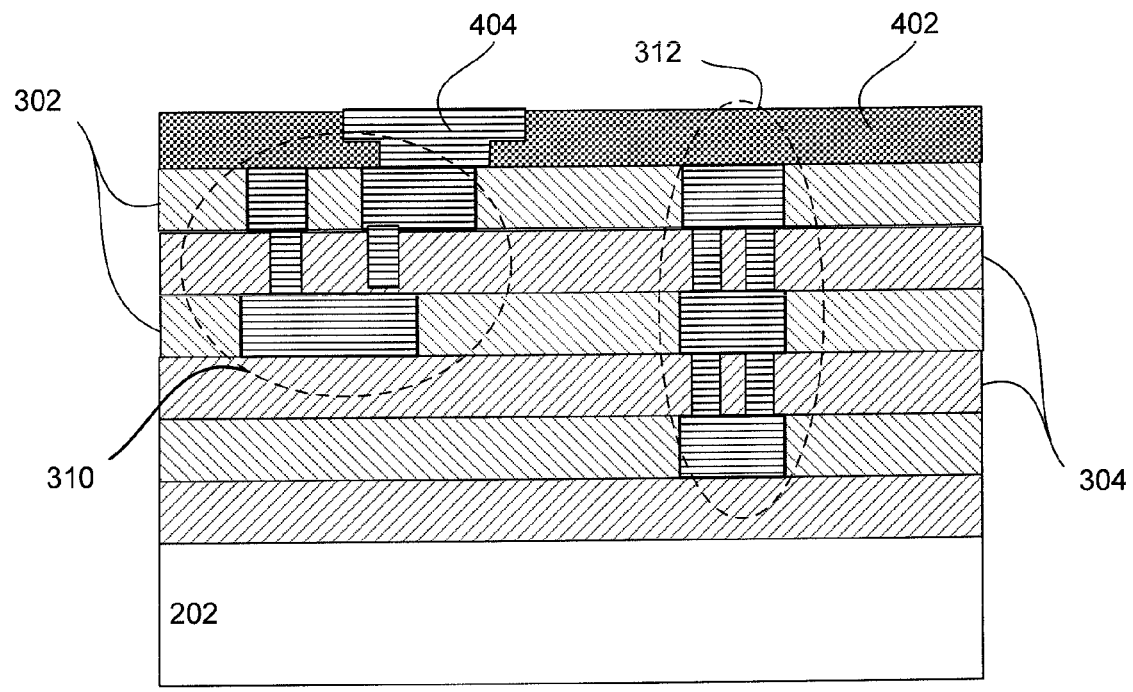

FIGS. 2-4 illustrate the fabrication of a reconfigurable semiconductor. FIG. 2 shows a substrate 202 and dielectric isolation layer 204 on which metal semiconductor circuits may be formed. FIG. 3 illustrates formation of a plurality of wiring layers 302 and dielectric layers 304 on the silicon substrate and dielectric shown in FIG. 2. The dielectric layers 304 separate adjacent ones of the plurality of wiring layers 310. The wiring layers are patterned to implement at least one circuit 310 and at least one via stack 312 that are electrically isolated from each other.

The via stack is implemented by forming a metal plate 320 in each of the wiring layers. The metal plates of adjacent wiring layers are vertically aligned and electrically connected to each other by means of vias 322 formed in the dielectric layer that separates the adjacent wiring layers. The metal plate size within the metal layers can be designed with respect to metal tiling design rules. The metal plate size within the metal layers can be minimized with respect to the required sheet resistance. The size and distribution of metal vias 322 can be designed with respect to metal tiling design rules and electrical requirements.

FIG. 4 illustrates formation of a passivation layer and front-side contact pad in the die shown in FIG. 3. An additional passivation layer 402 is formed over the metal wiring layers. The passivation layer 402 is a non-reactive surface film, such as an oxide or a nitride, that inhibits corrosion of the wiring layers 302. To provide an external contact for the circuit, a front-side contact pad 404 is formed in the passivation layer 402. As described above, some applications may use the front side contact pad of the die configuration shown in FIG. 4. In other applications, post-fabrication processes may further configure the die to implement one or more backside contacts.

Figure 5:
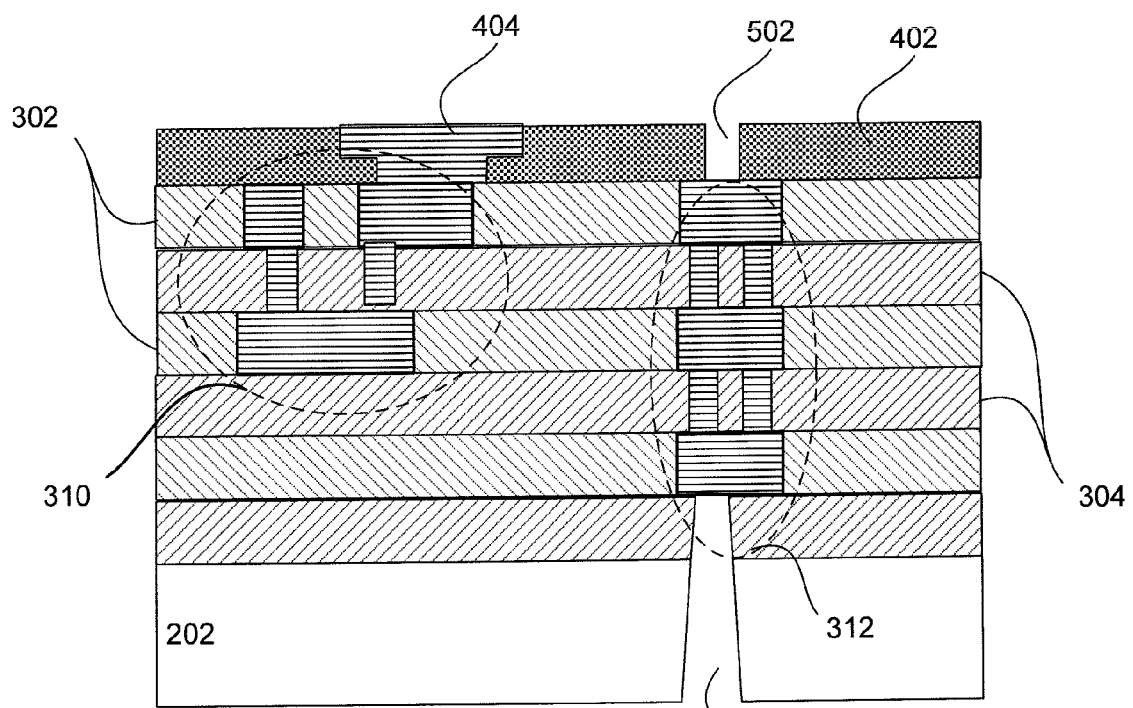
FIGS. 5 and 6 illustrate post-fabrication reconfiguration of the reconfigurable semiconductor shown in FIG. 4.
Figure 6:
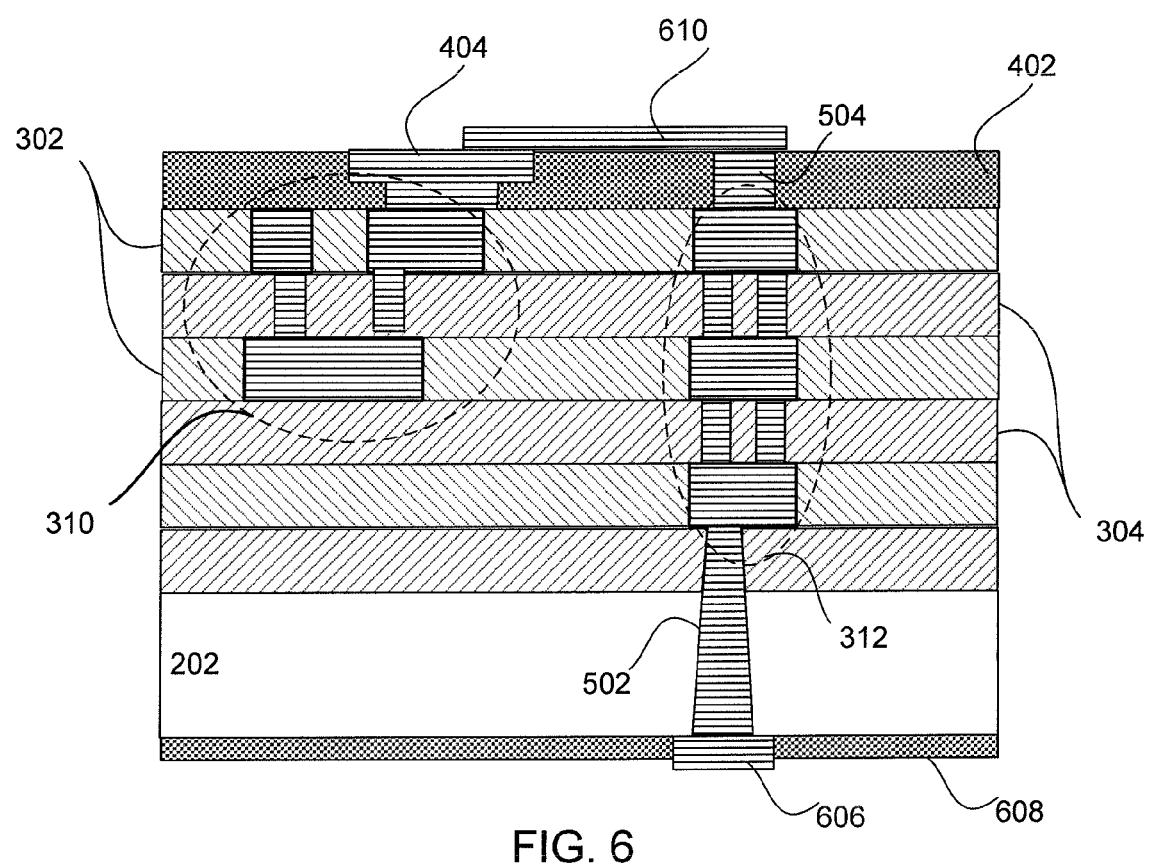

FIGS. 5 and 6 illustrate post-fabrication configuration of the reconfigurable semiconductor shown in FIG. 4. The die may be reconfigured to implement a TSV, as shown in FIG. 1, that can electrically couple a front-side contact to a back-side contact pad.

Through silicon vias can be difficult to implement because etching often requires etching through several different materials. Because different materials etch at different rates, side walls of the etched via trench can be uneven. As a result, deposition of conductive and/or isolative materials in the via can be difficult. The uneven shape may also adversely affect electrical properties of the via such as inductance and capacitance. Deposition of conductive material in a TSV is also difficult due to higher aspect ratio of height to width in comparison to standard vias. The formation of a TSV entails deep etching through the majority of a die, forming a dielectric oxide layer along the sides of the TSV, and filling or plating of the TSV with a conductive material. However, at high aspect ratios, current methods of via formation may cause oxide or metal plating of the via to form significantly faster at the top of the via than at the bottom. In addition to non-uniformity caused by the uneven deposition rates, the rapid growth at the top of the TSV may cause voids to become trapped in the TSV. Such variation and defects may be avoided by implementing the TSV with the via stack 322 because the via stack is formed using a number of smaller vias which have a smaller aspect ratio.

By configuration the wiring layers to implement the via stack 312 during fabrication of the circuit, a through silicon via may be implemented post-fabrication with the formation of a via through the passivation layer and a via through the substrate.

FIG. 5 illustrates formation of vias on the front and backsides of the die shown in FIG. 4 allowing access to the via stack 312. A first via 502 is formed in the passivation layer and a second via 504 is formed through the silicon substrate 202.

FIG. 6 illustrates filling of the vias 502 and 504 and reconfiguration of the die to connect the circuit 310 to a back-side contact 606. In some embodiments, an insulative material may be deposited to isolate the TSV from the substrate. After vias 502 and 504 are filled or plated, a back-side contact is formed on the back-side of the die. The back-side contact is electrically coupled to via stack 312 through plated via 502. Post fabrication wiring 610 is formed over the passivation layer to electrically couple the back-side contact 606 to the circuit 310 through vias 502 and 504, via stack 312, and front-side contact 404. After reconfiguration, some embodiments may form a second passivation layer 608 on the back-side of the substrate 202. A third passivation layer (not shown) may also be formed over the wire 610 and front-side contact 404 to prevent corrosion.

Figure 7:
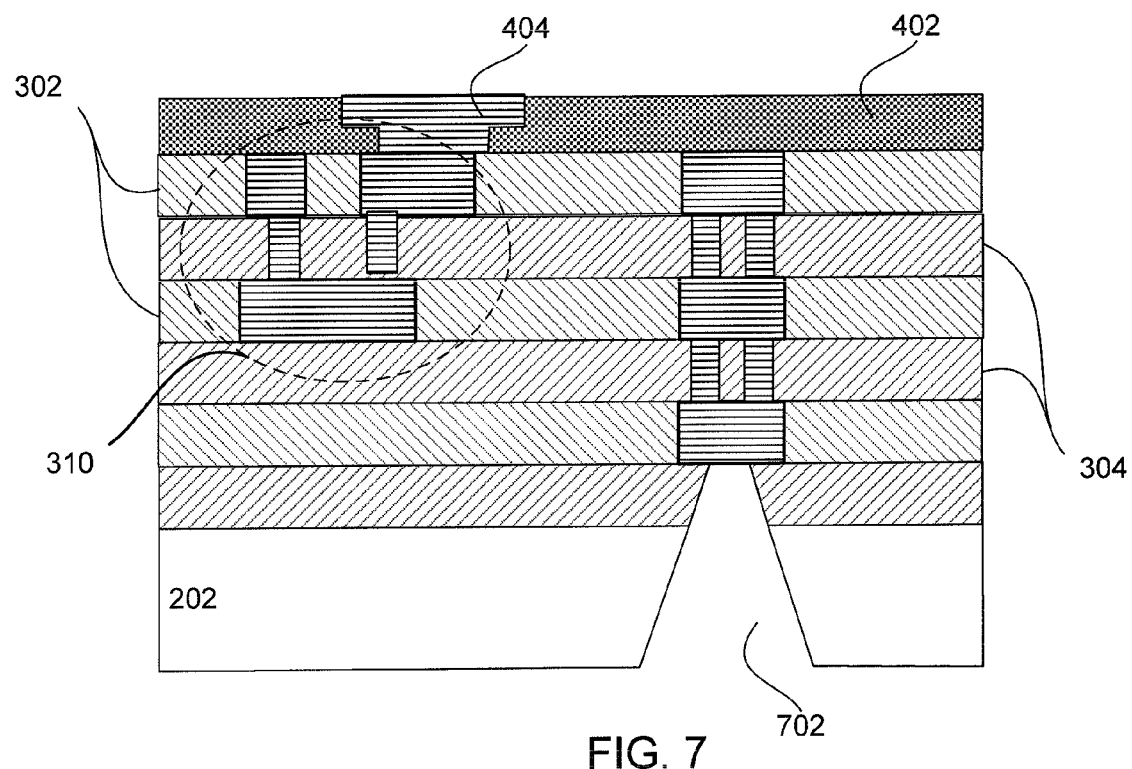
FIGS. 7 and 8 illustrate a second method for formation of a back-side via and contact connected to the stacked via.
Figure 8:
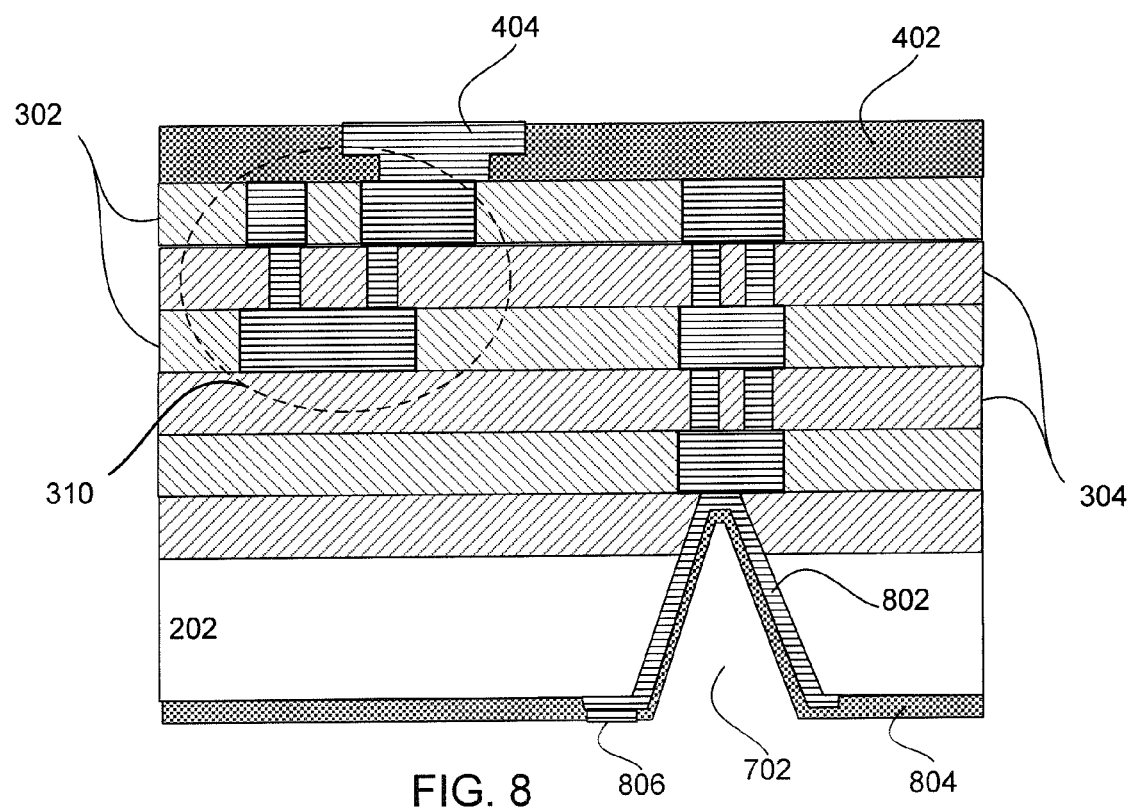

It is recognized that the back-side via through the substrate 202 may be formed using a variety of via formation methods. In FIG. 6, vias 502 and 504 are illustrated as having a taper angle close to 90 degrees and being completedly filled with conductive metal. Alternatively, other vias may be metal plated and/or tapered at other angles. For example, FIGS. 7 and 8 illustrate a second method for formation of a back-side via and contact connected to the stacked via of FIG. 4. FIG. 7 illustrates the formation of a conically shaped tapered via trench in substrate 202. FIG. 8 illustrates plating of the conically shaped tapered via. Because of the surface area of the conically shaped via, the via 702 may be plated with a thin metal plating 802. A passivation layer 804 is formed over the via plating 802. A back-side contact pad 806 is formed in the passivation layer and is electrically coupled to the metal plating 802.

Based upon the above discussion and illustrations, those skilled in the art will readily recognize that various modifications and changes may be made without strictly following the exemplary embodiments and applications illustrated and described herein. Such modifications do not depart from the true spirit and scope of the present disclosure, including that set forth in the following claims.

What is claimed is:

1. A method of forming a plurality of semiconductors: comprising:

forming a plurality of identical semiconductor dice, each die including:
a substrate;
a plurality of wiring layers and dielectric layers, the dielectric layers separating adjacent ones of the wiring layers, and the wiring layers implementing a circuit;
a passivation layer formed on the plurality of wiring layers;
a front-side contact pad formed in the passivation layer and electrically coupled to the circuit; and
a via stack formed through the plurality of wiring and dielectric layers, the via stack electrically isolated from the circuit implemented by the wiring layers; and for each of a first subset of the plurality of identical semiconductor dice including at least one die, leaving the circuit electrically isolated from the via stack; and for each of a second subset of the plurality of identical semiconductor dice, the second subset being mutually exclusive from the first subset and including at least one die, forming a back-side contact by performing the steps including:

forming a first via through the passivation layer and electrically coupled to the via stack;

forming a wire on the passivation layer, the wire electrically coupling the front-side contact pad to the first via; and forming a second via extending from a back-side of the substrate and through the substrate, the second via electrically coupled to the via stack.

2. The method of claim 1, further comprising, for each die in the second subset, forming a second passivation layer over the front-side contact pad and over the wire formed on top of the passivation layer of the at least one of the dice.

3. The method of claim 1, further comprising, for each die in the second subset, forming a back-side contact pad on a back-side of the substrate of the at least one of the dice, the contact pad electrically coupled to the second via.

4. The method of claim 3, further comprising:

packaging each die of the first subset in a respective first semiconductor package, the first semiconductor package having an external contact wirebonded to the front-side contact pad; and packaging each die of the second subset in a respective second semiconductor package, the second semiconductor package having an external contact wirebonded to the back-side contact pad.

5. The method of claim 1, wherein the via stack formed through the plurality of wiring and dielectric layers is electrically isolated from the substrate.

6. The method of claim 1, further comprising the step of producing a semiconductor apparatus by using the steps recited in claim 1.

7. A method of forming a semiconductor with a back-side contact: comprising:

forming a semiconductor die including:
a substrate;
a plurality of wiring layers and dielectric layers, the dielectric layers separating adjacent ones of the wiring layers, and the wiring layers implementing a circuit;
a passivation layer formed on the plurality of wiring layers;
a front-side contact pad formed in the passivation layer and electrically coupled to the circuit; and
a via stack formed through the plurality of wiring and dielectric layers, the via stack electrically isolated from the circuit implemented by the wiring layers; and reconfiguring the die to have a back-side contact by performing the steps including:

forming a first via through the passivation layer and electrically coupled to the via stack;

forming a wire on the passivation layer, the wire electrically coupling the front-side contact pad to the first via; and forming a second via extending from a back-side of the substrate and through the substrate, the second via electrically coupled to the via stack.

8. The method of claim 7, further comprising, forming a second passivation layer over the front-side contact pad and over the wire formed on top of the passivation layer of the die.

9. The method of claim 7, further comprising forming a back-side contact pad electrically coupled to the second via on a back-side of the substrate of the die.

10. The method of claim 7, wherein the via stack is electrically isolated from thesubstrate.

11. The method of claim 7, wherein the second via is conical.

12. The method of claim 7, further comprising forming a second passivation layer over the front-side contact pad and over the wire formed on top of the passivation layer of the die; and forming a back-side contact pad electrically coupled to the second via on a back-side of the substrate of the die.

13. The method of claim 12, wherein the via stack is electrically isolated from substrate; and wherein the second via is conical.

* * * * *